United States Patent [19]

Ninomiya

[11] Patent Number: 5,617,359
[45] Date of Patent: Apr. 1, 1997

[54] ELECTRICALLY ERASABLE AND PROGRAMMABLE READ ONLY MEMORY DEVICE WITH SOURCE VOLTAGE CONTROLLER FOR QUICKLY ERASING DATA

[75] Inventor: Kazuhisa Ninomiya, Tokyo, Japan

[73] Assignee: NEC Corporation, Japan

[21] Appl. No.: 542,176

[22] Filed: Oct. 12, 1995

[30] Foreign Application Priority Data

Oct. 12, 1994 [JP] Japan .................................. 6-245737

[51] Int. Cl.⁶ .................................................. G11C 11/34
[52] U.S. Cl. ................................ 365/185.29; 365/185.18; 365/185.2
[58] Field of Search ..................... 365/185.29, 185.18, 365/185.22, 185.2

[56] References Cited

U.S. PATENT DOCUMENTS 5,287,317 2/1994 Kobayashi et al. ................ 365/185.29
5,347,490 9/1994 Terada et al. ....................... 365/185.06
5,442,586 8/1995 Javanifard et al. ................ 365/185.29

FOREIGN PATENT DOCUMENTS

4-228193 8/1992 Japan .

Primary Examiner—David C. Nelms
Assistant Examiner—Huan Hoang
Attorney, Agent, or Firm—Ostrolenk, Faber, Gerb & Soffen, LLP

[57] ABSTRACT

An electrically erasable and programmable read only memory device concurrently erases data bits stored in the memory cells by evacuating electrons from the floating gate electrodes to a source line, and an erase and verify system incorporated in the electrically erasable and programmable read only memory device continues the erasing pulse without a verify until most of the electrons are evacuated so as to quickly complete the erasing operation.

11 Claims, 9 Drawing Sheets

ELECTRICALLY ERASABLE AND PROGRAMMABLE READ ONLY MEMORY DEVICE WITH SOURCE VOLTAGE CONTROLLER FOR QUICKLY ERASING DATA

FIELD OF THE INVENTION

This invention relates to an electrically erasable and programmable read only memory device and, more particularly, to an electrically erasable and programmable read only memory device having floating gate type memory cells concurrently erasable by applying erasing voltage to source lines.

DESCRIPTION OF THE RELATED ART

Figure 1:
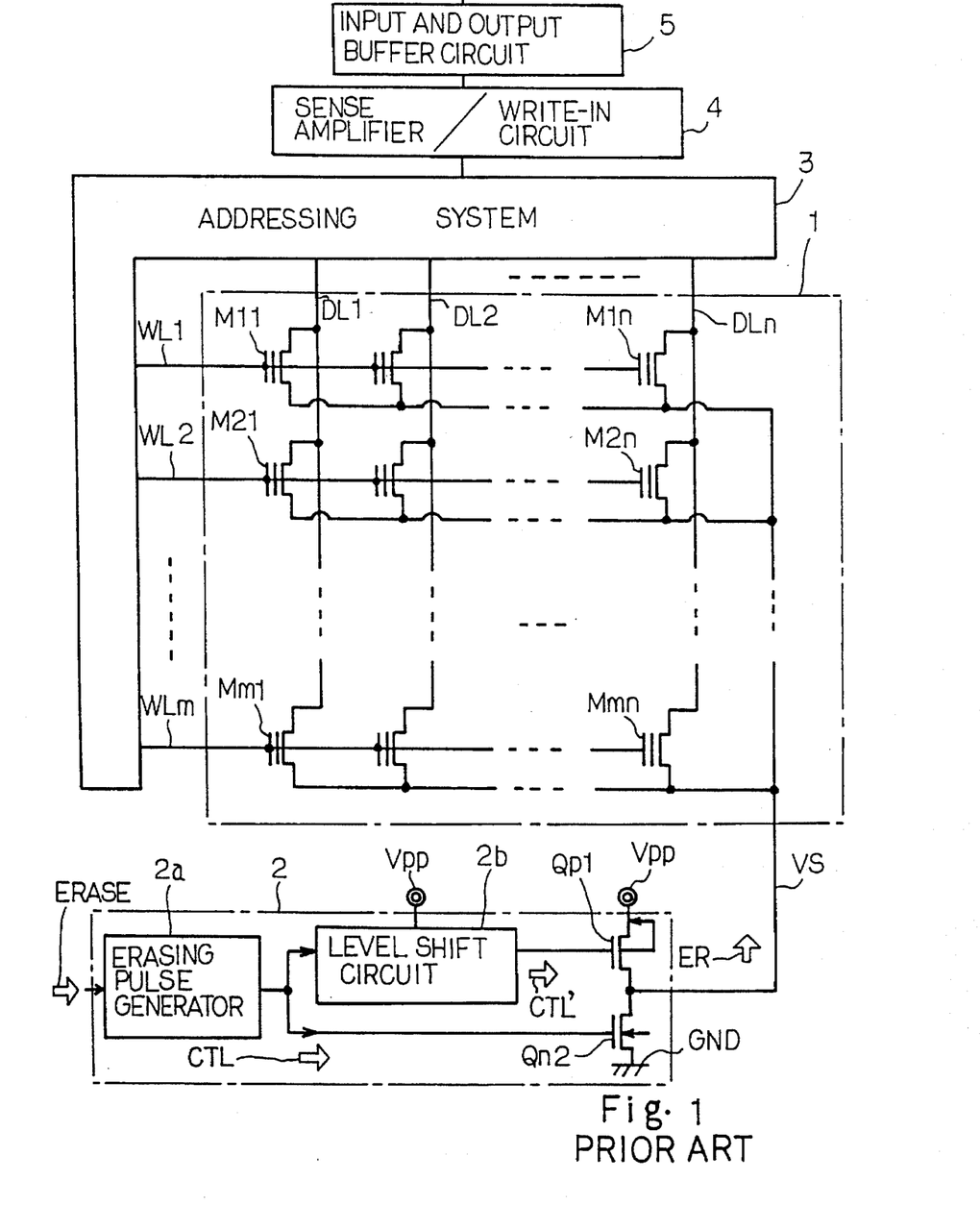
FIG. 1 is a block diagram showing the arrangement of the prior art electrically erasable and programmable read only memory device.

A typical example of the electrically erasable and programmable read only memory device is illustrated in FIG. 1 of the drawings, and is disclosed in Japanese Patent Publication of Unexamined Application No. 4-228193. The prior art electrically erasable and programmable read only memory device comprises a memory cell array 1 implemented by floating gate type memory cells M11 to M1n, M21 to M2n, ... and Mm1 to Mmn, an erasing system 2 for erasing data bits stored in the floating gate type memory cells M11 to Mmn, an addressing system 3 for selecting a floating gate type memory cell from the memory cell array 1, a sense amplifier/write-in circuit 4 and a data input-output buffer circuit 5. The prior art electrically erasable and programmable read only memory device selectively enters into a write-in mode, a read-out mode and an erase/verify mode.

A plurality of word lines WL1, WL2, ... and WLm are respectively associated with the rows of floating gate type memory cells M11 to M1n, M21 to M2n, ... and Mm1 to Mmn, and each word line WL1/WL2/.../WLm is connected to the control gate electrodes of the associated floating gate type memory cells. The word lines A plurality of digit lines DL1, DL2, ... and DLn are respectively associated with the columns of floating gate type memory cells M11-Mm1 to M1n-Mmn, and each digit line DL1/DL2/.../DLn is connected to the drain nodes of the associated floating gate type memory cells.

A source line VS is shared among all of the floating gate type memory cells M11 to Mmn, and is coupled between the source nodes of the floating gate type memory cells M11 to Mmn and the erasing system 2.

The erasing system 2 includes an erasing pulse generator 2a, a level-shift circuit 2b, a series combination of a p-channel enhancement type field effect transistor Qp1 and an n-channel enhancement type field effect transistor Qn2 and an erase/verify control circuit (not shown). The erasing pulse generator 2a is responsive to an erase initiation signal ERASE so as to generate a control pulse signal IER, and the pulse width of the control pulse signal CTL is much shorter than a time period for completely erasing data bits stored in the floating gate type memory cells M11 to Mmn. The control pulse signal CTL is supplied to the level-shift circuit 2b and the gate electrode of the n-channel enhancement type field effect transistor Qn2.

The level-shift circuit 2b changes the standard voltage range of 5 volts to a high power voltage range of 12 volts, and supplies a high-level control pulse signal CTL' to the gate electrode of the p-channel enhancement type field effect transistor Qp1. The high-level control pulse signal CTL' is an in-phase signal to the control pulse signal CTL.

The series combination of the p-channel enhancement type field effect transistor Qp1 and the n-channel enhancement type field effect transistor Qn2 is coupled between an erasing voltage source Vpp and a ground voltage line GND, and the erasing voltage source Vpp supplies 12 volts to the source node of the p-channel enhancement type field effect transistor Qp1. The control pulse signal CTL and the high-level control pulse signal CTL' alternately switch the p-channel enhancement type field effect transistor Qp1 and the n-channel enhancement type field effect transistor Qn2, and supplies an erasing pulse signal ER to the source line VS. Table 1 summarizes the relation between the control/high-level control signals CTL/CTL' and the erasing pulse signal ER.

TABLE 1

| | Erasing Pulse in Active level on Source line | Erasing Pulse in Inactive level |
|---|---|---|
| Control Pulse Signal CTL | ground level | Vpp (12 volts) |
| High-level Control Pulse Signal CTL' | ground level | Vcc (5 volts) |

The erase/verify circuit (not shown) supervises an erase and verify sequence as described hereinlater in detail.

The addressing system 3 selects one of the word lines WL1 to WLm and one of the digit lines DL1 to DLn, and the selected word line and the selected digit line couples one of the floating gate type memory cells M11 to Mmn through the sense amplifier/write-in circuit 4 to the input and output buffer circuit 5. While the prior art electrically erasable and programmable read only memory device is in the write-in phase, the input data buffer of the input and output buffer circuit 5 is connected through the write-in circuit to the selected digit line, and electrons are injected to or not injected to the selected floating gate type memory cell depending upon the logic level of the write-in data bit. On the other hand, current is supplied through the selected digit line to the selected floating gate type memory cell to see whether or not a conductive channel takes place in the selected floating gate type memory cell, and the sense amplifier amplifies the potential level on the selected digit line so as to produce an output data signal in the output data buffer of the input and output buffer circuit 5.

The prior art electrically erasable and programmable read only memory device thus arranged behaves in the erasing mode as follows. When the erase initiation signal ERASE is supplied to the erasing pulse generator 2a, the erasing pulse generator 2a generates the control pulse signal CTL, and the level-shift circuit 2b outputs the high-level control pulse signal CTL' in synchronism with the control pulse signal CTL. When the control pulse signal CTL and the high-level control pulse signal CTL' are changed to the ground voltage level, the p-channel enhancement type field effect transistor Qp1 turns on, and the n-channel enhancement type field effect transistor Qn2 turns off. Then, the erasing voltage Vpp is supplied to the source line VS, and the source line VS propagates the erasing voltage Vpp to the source nodes of the floating gate type memory cells M11 to Mmn. Large potential difference takes place between the floating gate electrodes and the source nodes, and accumulated electrons are evacuated from the floating gate electrodes to the source line VS as the Fouler-Nordheim tunneling current. Then, the floating gate type memory cells M11 to Mmn concurrently enter into erased state.

On the other hand, when the control pulse signal CTL and the high-level control pulse signal CTL' are changed to the respective high levels, the n-channel enhancement type field effect transistor Qn2 turns on, and the p-channel enhancement type field effect transistor Qp1 turns off. As a result, the erasing pulse signal ER is changed to the inactive low level, and the evacuation of the accumulated electron is interrupted.

As described hereinbefore, the erasing pulse ER is much shorter than time period perfectly erasing all of the floating gate type memory cells, and the erase and verify sequence is repeated until all the floating gate type memory cells are erased. The repetition of the erase prevents the floating gate type memory cells M11 to Mmn from excessively erased state where the threshold of the floating gate type memory cells M11 to Mmn takes a negative value.

Figure 2:
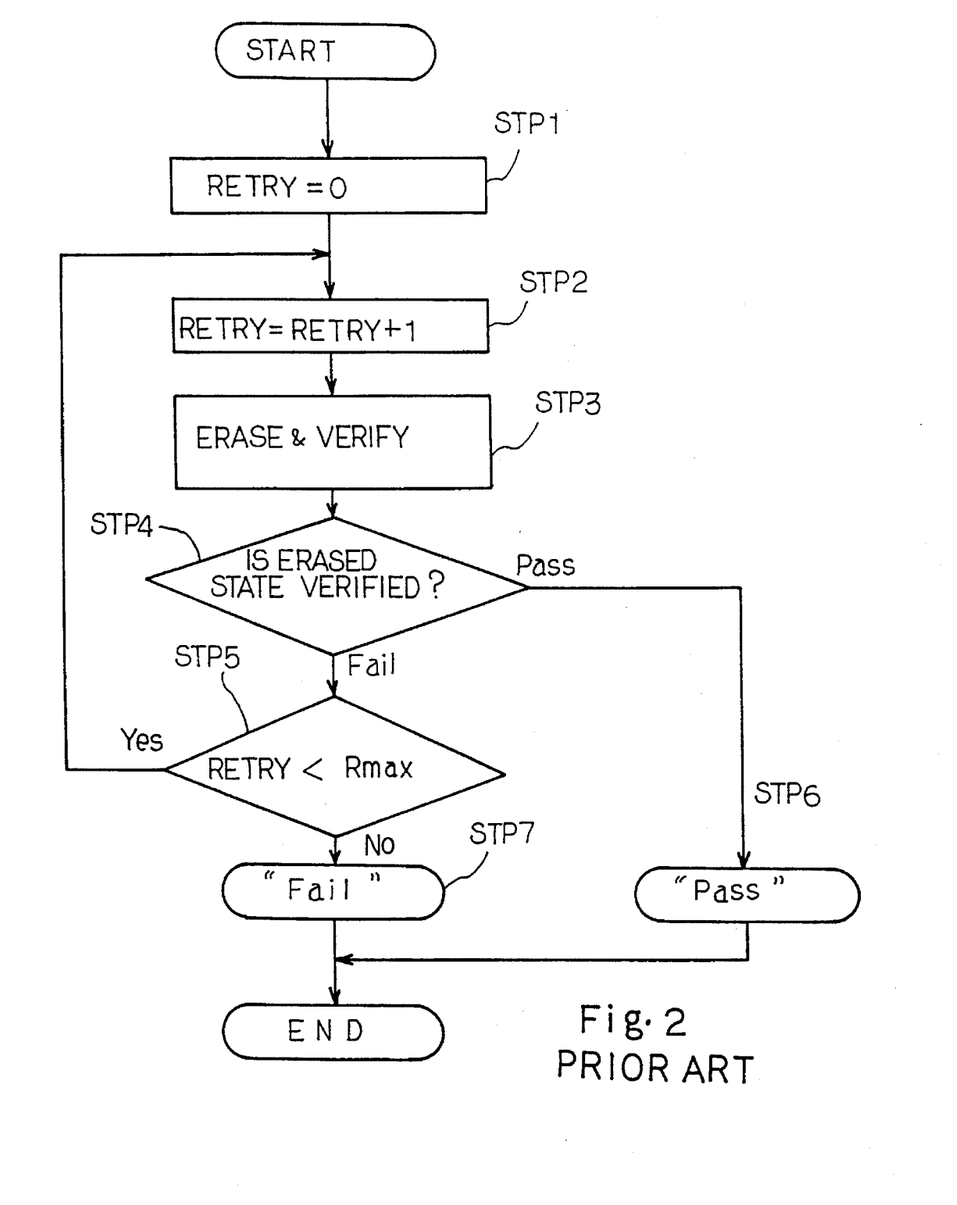
FIG. 2 is a flow chart showing the erase and verify sequence carried out in the prior art electrically erasable and programmable read only memory device.

FIG. 2 illustrates the erase and verify sequence under the control of the erase and verify controlling circuit (not shown). First, erase and verify controlling circuit writes zero into an internal register RETRAY as by step STP1, and proceeds to step STP2. The internal register RETRY is incremented by one at step STP2, and the instructs the erase pulse generator 2a to change the control pulse signal to the ground voltage level. Then, the erasing pulse signal ER is supplied to the source line VS, and the verify follows the erase as by step STP3.

Namely, the erase and verify controlling circuit cooperates with the addressing system 3 and the sense amplifier 4, and floating gate type memory cells M11 to Mmn are sequentially addressed to see whether or not all the floating gate type memory cells M11 to Mmn enter into the erased state.

If there is a floating gate type memory cell still in write-in state, the answer at step STP4 is given "Fail", and the value stored in the internal register RETRY is checked to see whether or not the erase and verify sequence is repeated predetermined times Rmax.

While the repetition does not reach the predetermined times Rmax, the erasing system 2 reiterates the loop consisting of steps STP2 to STP5, and repeats the erase and verify sequence.

While the erasing system 3 is repeatedly carrying out the erase and verify sequence, the answer at step STP4 is assumed to be changed to "Pass". Then, the erase and verify controlling circuit produces a diagnosis signal indicative of the perfectly erased state of the memory cell array 1 as by step STP6, and terminates the erase and verify operation.

On the other hand, if the erase and verify sequence is repeated the predetermined times Rmax, the answer at step STP5 is changed to negative "No", and the erase and verify controlling circuit produces the diagnostic signal indicative of the imperfectly erased state of the memory cell array 1 as by step STP7. The erase and verify operation is terminated.

The prior art electrically erasable and programmable read only memory device encounters a problem in the long erasing and verify operation.

SUMMARY OF THE INVENTION

It is therefore an important object of the present invention to provide an electrically erasable and programmable read only memory device which quickly completes an erase and verify operation.

To accomplish the object, the present invention proposes to continue an erasing pulse without a verify until floating gate type memory cells become close to erased state.

In accordance with the present invention, there is provided a semiconductor memory device comprising: a memory cell array having a plurality of memory cells each implemented by a floating gate type field effect transistor changed between an erased state and a write-in state depending upon a data bit stored therein; a write-in means for wring data bits into memory cells selected from the plurality of memory cells; a read-out means for reading the data bits from memory cells selected from the plurality of memory cells; an addressing system responsive to address signals so as to select a memory cell from the memory cell array; a source line connected to source nodes of the plurality of memory cells; and an erase and verify system enabled in an erase and verify mode having a first phase and a second phase next to the first phase, and including a first erasing means supplying an erasing signal of an active level to the source line in the first phase and monitoring a potential level on the source line for maintaining the erasing signal in the active level until the source line reaches a reference level close to the active level, a second erasing means intermittently supplying an erasing pulse signal of the active level to the source line for changing the plurality of memory cells to the erased state, and a verify means checking the plurality of memory cells to see whether or not the plurality of memory cells enter into the erased state while the erasing pulse signal is staying in an inactive level.

BRIEF DESCRIPTION OF THE DRAWINGS

The features and advantages of the electrically erasable and programmable read only memory device according to the present invention will be more clearly understood from the following description taken in conjunction with the accompanying drawings in which.

DESCRIPTION OF THE PREFERRED EMBODIMENTS

First Embodiment

Figure 3:
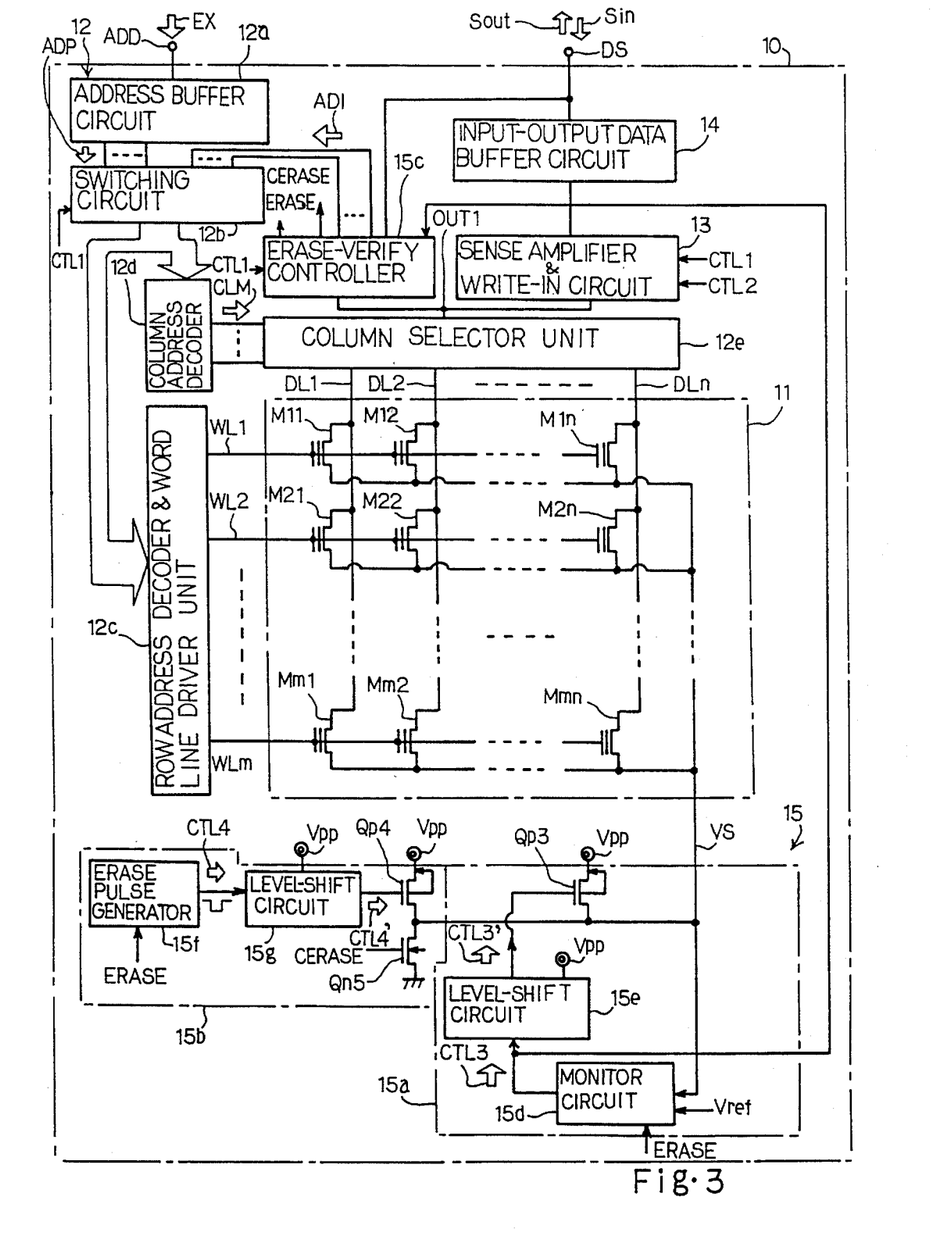
FIG. 3 is a block diagram showing the arrangement of an electrically erasable and programmable read only memory device according to the present invention.

Referring to FIG. 3 of the drawings, an electrically erasable and programmable read only memory device embodying the present invention is fabricated on a single semiconductor chip 10. The electrically erasable and programmable read only memory device selectively enters into a write-in mode, a read-out mode and an erase/verify mode as similar to the prior art electrically erasable and programmable read only memory device.

The electrically erasable and programmable read only memory device comprises a memory cell array 11, and a plurality of memory cells M11, M12, ... M1n, M21, M22, ... M2n and Mm1, Mm2, ... and Mmn form in combination the memory cell array 11. The memory cells M11 to Mmn are implemented by n-channel floating gate type field effect transistors, and are changed between erased state and write-in state depending upon electrons accumulated in the floating gate electrodes. While the n-channel floating gate type field effect transistor remains in the erased state, the n-channel floating gate type field effect transistor has relatively low threshold. On the other hand, if the accumulated electrons changes the n-channel floating gate type field effect transistor to the write-in state, the accumulated electrons increase the threshold, and the n-channel floating gate type field effect transistor has relatively high threshold.

The memory cells M11 to Mmn are arranged in rows and columns. A plurality of word lines WL1, WL2, ... and WLm are respectively associated with the rows of memory cells M11 to M1n, M21 to M2n, ... and Mm1 to Mmn, and each of the word lines WL1 to WLm is coupled to the control gate electrodes of the associated row of memory cells. Moreover, a plurality of digit lines DL1, DL2, ... and DLn are associated with the columns of memory cells M11 to Mm1, M12 to Mm2, ... and M1n to Mmn, respectively, and each of the digit lines DL1 to DLn is coupled to the drain nodes of the associated column of memory cells. Row addresses and column addresses are respectively assigned to the word lines WL1 to WLm and the digit lines DL1 to DLn, and each of the memory cells M11 to Mmn is addressable by using the word lines WL1 to WLm and the digit lines DL1 to DLn.

A source line VS is shared among all of the memory cells M11 to Mmn, and is coupled to the source nodes of the memory cells M11 to Mmn.

The electrically erasable and programmable read only memory device further comprises an addressing system 12. The addressing system 12 includes an address buffer circuit 12a coupled to the address port ADD. An external address signal EX is supplied through the address port ADD to the address buffer circuit 12a, and the address buffer circuit 12a produces address predecoded signals ADP from the external address signal EX.

The addressing system further includes a switching circuit 12b. The switching circuit 12b is responsive to an internal control signal CTL1 indicative of one of the write-in/read-out mode and the erase/verify mode for selecting the address predecoded signals ADP and internal address signals ADI.

The addressing system further includes a row address decoder/word line driver unit 12c, a column address decoder unit 12d and a column selector unit 12e. The address predecoded signals ADP indicative of a row address are supplied from the switching circuit 12b to the row address decoder/word line driver unit 12c in the write-in/read-out modes, and the row address decoder/word line driver unit 12c changes one of the word lines WL1 to WLm to read-out voltage level or the write-in voltage level. On the other hand, the internal address signals ADI indicative of a row address are supplied from the switching circuit 12b to the row address decoder/word line driver unit 12c in the erase/verify mode, and the row address decoder/word line driver unit 12c changes one of the word lines WL1 to WLm to the write-in voltage level or the read-out voltage level as similar to the write-in/read-out modes.

The column decoder unit 12d is also coupled to the switching circuit 12b, and the address predecoded signals indicative of a column address and the internal address signals ADI indicative of a column address are selectively supplied to the column address decoder unit 12d depending upon the operation mode. The column address decoder unit 12d decodes the address predecoded signals ADP or the internal address signals ADI into column address decoded signals CLM, and the column address decoded signals CLM are supplied to the column selector unit 12e.

The column selector 12e is coupled to the digit lines DL1 to DLn, and is responsive to the column address decoded signals CLM so as to connect one of the digit lines DL1 to DLn to the output port OUT1 thereof.

The electrically erasable and programmable read only memory device further comprises a sense amplifier/write-in circuit 13 coupled to the output port OUT1 of the column selector unit 12e. The sense amplifier/write-in circuit 13 is responsive to the internal control signal CTL1 so as to be enabled in the write-in/read-out modes, and another internal control signal CTL2 selectively enables the sense amplifier and the write-in circuit. The sense amplifier is, by way of example, implemented by a current mirror circuit. The sense amplifier supplies read-out current through the column selector 12e to the selected digit line in the read-out mode, and amplifies the potential level on the selected digit line. On the other hand, the write-in circuit supplies a write-in voltage through the column selector 12e to the selected digit line in the write-in mode, and causes hot electrons to be injected into the floating gate electrode of the selected memory cell.

The electrically erasable and programmable read only memory device further comprises an input-output data buffer circuit 14 coupled to the sense amplifier/write-in circuit 13. The input-output data buffer circuit 14 produces an output data signal Sout from the potential level transferred from the sense amplifier in the read-out mode, and instructs the write-in circuit whether to supply the write-in voltage to the selected digit line or not in the write-in mode.

The electrically erasable and programmable read only memory device further comprises an erase and verify system 15 activated in the erase/verify mode. The erase/verify mode has a first phase and a second phase after the first phase. The erase and verify system 15 carries out an erase without a verify in the first phase and alternately repeats an erase and a verify in the second phase.

Figure 4:
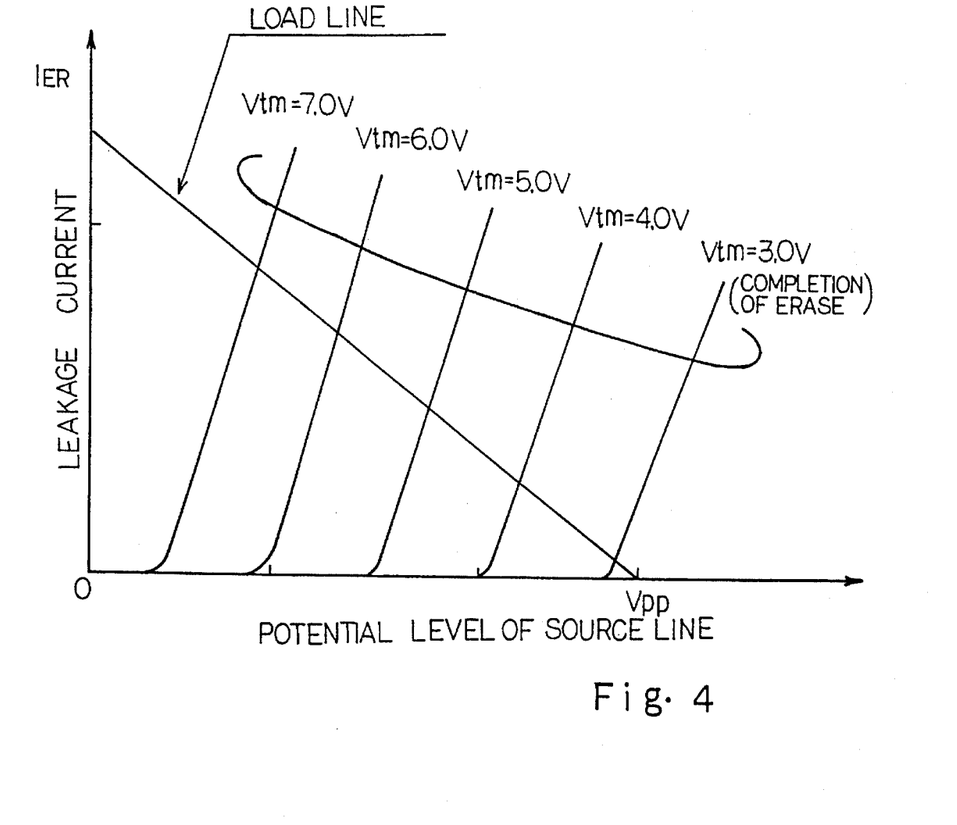
FIG. 4 is a graph showing relation among erasing current, a potential level on a source line and a threshold of a floating gate type field effect transistor.
Figure 5:
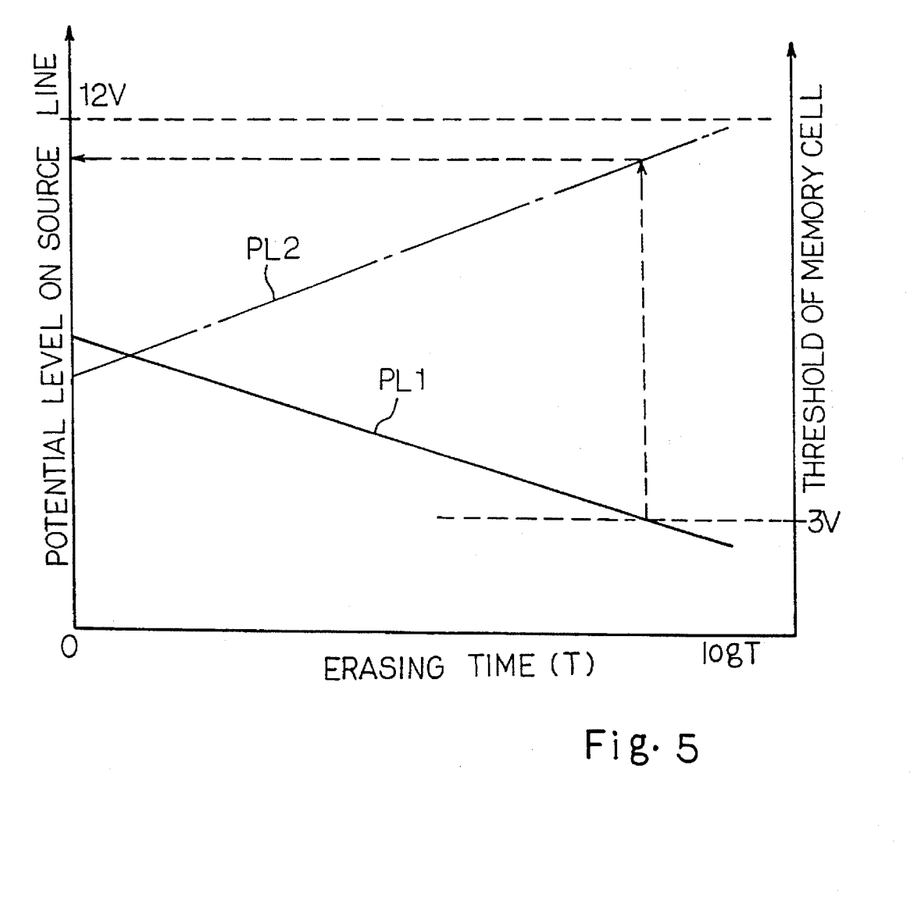
FIG. 5 is a graph showing relation among the potential level, the threshold and erasing time.

When large potential difference is applied between the source line VS and the floating gate electrode of the memory cells M11 to Mmn, depletion layers take place between the source regions of the memory cells M11 to Mmn and the floating gate electrodes, and leakage current flows from the source regions into the semiconductor substrate 10. The amount of current is proportional to the potential difference between the floating gate and the source region and, accordingly, to the amount of electron accumulated in the floating gate electrode or the threshold of the memory cell as shown in FIG. 4. As will be understood, when the threshold is lowered, the leakage current from the source regions to the semiconductor substrate 10 is decreased, and the potential level on the source line VS is increased. Thus, the threshold of the memory cell is inversely proportional to the erasing time, but the potential level on the source line VS is proportionally increased with time as shown in FIG. 5. FIG.

5 teaches that the threshold of the memory cells M11 to Mmn is estimable on the basis of the potential level on the source line VS, and the erase and verify system 15 changes the first phase to the second phase when the potential level on the source line VS becomes close to the erasing voltage vpp.

The erasing system 15 is broken down into a first erasing sub-system 15a used in the first phase, a second erasing sub-system 15b used in the second phase and a verify sub-system 15c cooperating with the second erasing sub-system 15b in the second phase. An erase-verify controller serves as the verify sub-system 15c.

The first erasing sub-system 15a includes a potential monitor circuit 15d coupled to the source line VS, a p-channel enhancement type switching transistor Qp3 coupled between a source of an erasing voltage Vpp and the source line VS and a level shift circuit 15e coupled to the potential monitor circuit 15d for controlling the p-channel enhancement type switching transistor Qp3.

The potential monitor circuit 15d is enabled with an erase initiation signal ERASE of the positive power voltage Vcc of 5 volts supplied from the erase-verify controller 15c, and compares the potential level on the source line VS with a reference voltage Vref. While the potential level on the source line VS is lower than the reference voltage Vref, the potential monitor circuit 15d supplies an internal control signal CTL3 of the ground voltage level to the level-shift circuit 15e. The potential monitor circuit 15d maintains the internal control signal CTL3 at the positive power voltage level Vcc before the application of the erase initiation signal ERASE of the positive power voltage Vcc, and changes the internal control signal CTL3 from the ground voltage level to the positive power voltage Vcc upon matching the potential level on the source line VS with the reference voltage Vref.

In this instance, the erasing voltage level Vpp is of the order of 12 volts, and the reference voltage is 80–90 percent of the erasing level Vpp. In detail, the reference voltage level Vref falls within the range between the erasing voltage level Vpp at 12 volts and the positive power voltage level at 5 volts. As shown in FIG. 4, when the threshold Vtm becomes equal to or lower than 3 volts, the memory cell enters into the erased state. The potential level on the source line VS at the threshold Vtm of 3 volts is experimentally determined to be about 11 volts as shown in FIG. 5. Therefore, it is desirable to regulate the reference voltage level Vref between 10 volts to 11 volts, and the desirable range is 80 percent to 90 percent of the erasing voltage Vpp.

The internal control signal CTL3 is further supplied to the erase-verify controller 15c, and the erase-verify controller 15c changes the erase initiation signal ERASE from the positive power voltage Vcc to the ground voltage level upon the recovery of the internal control signal CTL3 to the positive power voltage level Vcc. The erase initiation signal ERASE of the ground voltage disables the potential monitor circuit 15d, and causes the potential monitor circuit 15d to change the internal control signal CTL3 to the positive power voltage level Vcc. Thus, the first erase initiation signal ERASE of the positive power voltage level Vcc defines the first phase of the erase and verify mode, and the p-channel enhancement type switching transistor Qp3 continuously supplies the erasing voltage Vpp to the source line VS over the first phase.

The level shift circuit 15e boosts the internal control signal CTL3 of the positive power voltage Vcc to the erasing voltage Vpp, and supplies the internal control signal CTL3' changed between the ground voltage level and the erasing voltage level Vpp to the gate electrode of the p-channel enhancement type switching transistor Qp3. While the erasing voltage Vpp is being supplied to the gate electrode of the p-channel enhancement type switching transistor Qp3, the p-channel enhancement type switching transistor Qp3 is turned off, and isolates the source line VS from the source of erasing voltage Vpp.

The second erasing sub-system 15b is similar to the erasing system incorporated in the prior art electrically erasable and programmable read only memory device. Namely, the second erasing sub-system 15b includes an erasing pulse generator 15f, a level-shift circuit 15g and a series combination of a p-channel enhancement type switching transistor Qp4 and an n-channel enhancement type switching transistor Qn5. Although the n-channel enhancement type field effect transistor Qn2 is gated with the control pulse signal CTL, the erase-verify controller 15c supplies the complementary erase initiation signal CERASE to the gate electrode of the n-channel enhancement type switching transistor Qn5.

The erase pulse generator 15f is responsive to the erase initiation signal ERASE of the positive power voltage Vcc so as to supply an internal control signal CTL4 of the ground voltage level to the level-shift circuit 15g, and the erase pulse generator 15f maintains the internal control signal CTL4 at the ground voltage level for predetermined time period as similar to that of the prior art. The predetermined time period is much shorter than time for perfectly erasing all the memory cells M11 to Mmn. Upon expire of the predetermined time period, the erase pulse generator 15f recovers the internal control signal to the positive power voltage level Vcc. Moreover, while the erase initiation signal CTL4 is staying in the ground voltage level, the internal control signal CTL4 is maintained at the positive power voltage level Vcc.

The level-shift circuit 15g boosts the positive power voltage level Vcc to the erasing voltage level Vpp, and the boosted internal control signal CTL4' is supplied to the gate electrode of the p-channel enhancement type switching transistor Qp4. While the boosted internal control signal CTL4' is being applied to the gate electrode of the p-channel enhancement type switching transistor Qp4, the p-channel enhancement type switching transistor Qp4 isolates the source line VS from the source of erasing voltage Vpp. On the other hand, the complementary erase initiation signal CERASE of the positive power voltage Vcc causes the n-channel enhancement type switching transistor Qn5 to turn on, and the n-channel enhancement type switching transistor Qn5 pulls the source line down to the ground voltage level.

The erase-verify controller 15c is responsive to the internal control signal CTL1 indicative of the erase and verify mode so as to supply the erase initiation signal ERASE and the complementary erase initiation signal CERASE to the first and second erasing sub-systems 15a and 15b. As described hereinbefore, the erase-verify controller 15c maintains the first erase initiation signal ERASE at the positive power voltage level Vcc until the receipt of the internal control signal CTL3 of the positive power voltage level Vcc. However, after the entry into the second phase, the erase-verify controller 15c periodically changes the erase initiation signal ERASE between the ground voltage level and the positive power voltage level Vcc.

While the erase initiation signal ERASE is staying in the ground voltage level in the second phase, the erase-verify controller 15c sequentially changes the internal address signal ADI so as to increment the row address and the column address, and sequentially checks the memory cells M11 to Mmn to see whether or not the all the memory cells M11 to Mmn are changed to the erased state.

The control sequence of the erase/verify system 15 is described hereinbelow with reference to FIGS. 4 and 5 of the drawings. When the internal control signal CTL1 indicative of the erase/verify mode is produced by a controller (not shown) incorporated in the electrically erasable and programmable read only memory device, the erase-verify controller 15c starts the erase/verify sequence, and supplies the first erase initiation signal ERASE of the positive power voltage level Vcc to the monitor circuit 15d and the erase pulse generator 15f at time t1 as by step ST10. The potential monitor circuit 15d changes the internal control signal CTL3 to the ground voltage level, and starts the monitoring on the potential level on the source line VS. The internal control signal CTL3 of the ground voltage level passes through the level-shift circuit 15e, and is applied to the gate electrode of the p-channel enhancement type switching transistor Qp3. Then, the potential level on the source line VS is gradually increased. The erase pulse generator 15f also changes the internal control signal CTL4 to the ground voltage level, and the internal control signal CTL4 is transferred through the level-shift circuit 15g to the gate electrode of the p-channel enhancement type switching transistor Qp4. The internal control signal CTL4 of the ground voltage level causes the p-channel enhancement type switching transistor Qp4 to turn on, and the complementary erase initiation signal ERASE of the ground voltage level maintains the n-channel enhancement type switching transistor Qn5 to turn off. For this reason, the p-channel enhancement type switching transistor Qp4 also charges the source line VS. However, the internal control signal CTL4 is recovered to the positive power voltage level Vcc at time t2, and the level shift circuit 15g causes the p-channel enhancement type switching transistor Qp4 to turn off. Thereafter, only the p-channel enhancement type switching transistor Qp3 continues to charge the source line VS.

Figure 6:
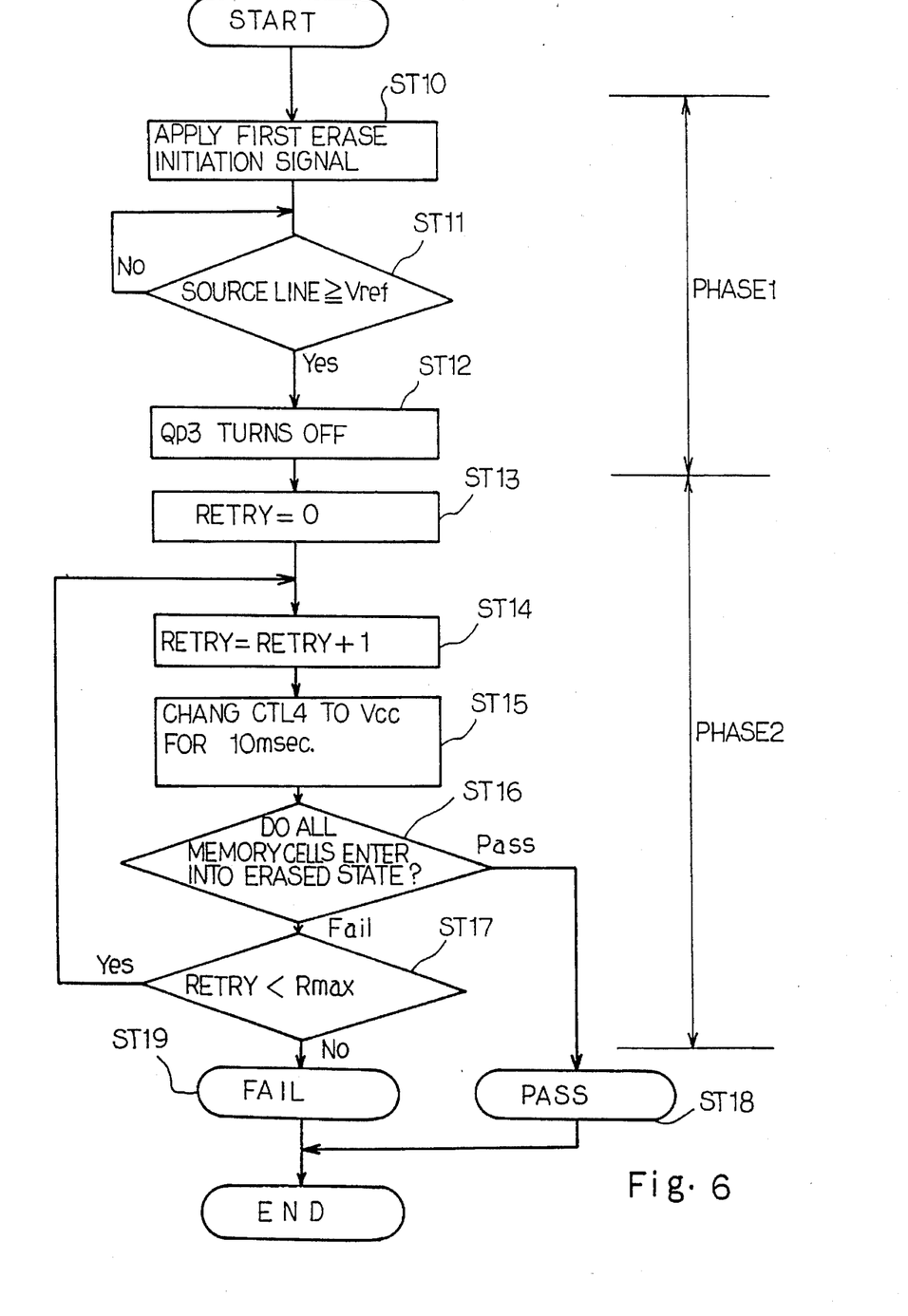
FIG. 6 is a flow chart showing a control sequence of an erase-verify controller incorporated in the electrically erasable and programmable read only memory device.
Figure 7:
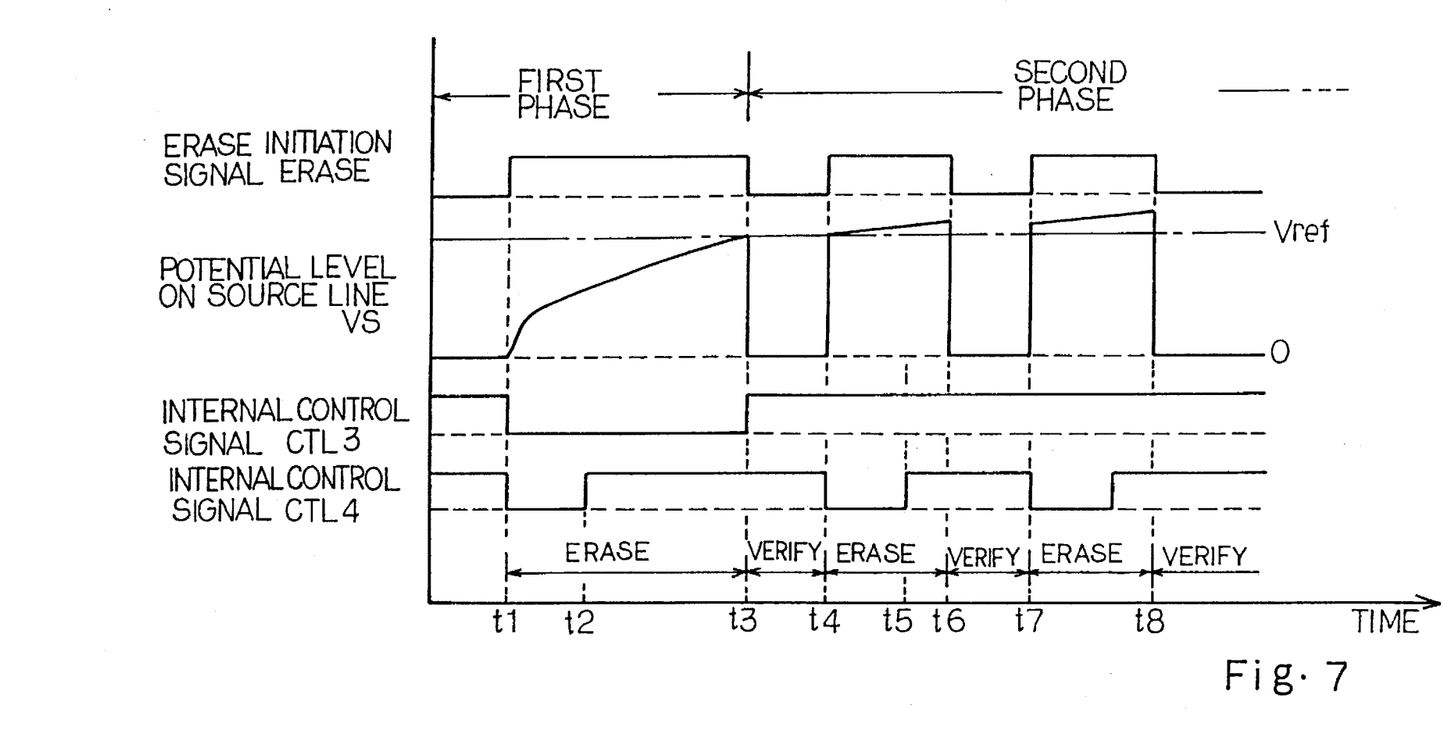
FIG. 7 is a graph showing an erasing and verify operation.

The potential monitor circuit 15d continuously charges the source line VS after time t2, and the potential level on the source line VS is increased toward the reference level Vref. The potential monitor circuit 15d compares the potential level on the source line VS with the reference level Vref to see whether or not the source line VS reaches the reference level Vref as by step ST11. While the potential level on the source line VS is lower than the reference level Vref, the potential monitor circuit 15d repeats step ST11, and the erase-verify controller 15c maintains the first erase initiation signal ERASE at the positive power voltage level Vcc.

If the potential level on the source line VS reaches the reference level Vref at time t3, the potential monitor circuit 15d changes the internal control signal CTL3 from the ground voltage level to the positive power voltage level Vcc, and the erase-verify controller 15c changes the erase initiation signal ERASE to the ground voltage level. The level-shift circuit 15e boosts the internal control signal CTL3 to the erasing voltage level Vpp, and the p-channel enhancement type switching transistor Qp3 turns off so as to isolate the source line VS from the source of erasing voltage Vpp as by step ST12. On the other hand, the complementary erase initiation signal CERASE is changed to the positive power voltage Vcc, and the n-channel enhancement type switching transistor Qn5 turns on. For this reason, the source line VS is discharged to the ground voltage level. The first phase is terminated at time t3, and the second phase starts.

The erase-verify controller 15c sets an internal counter RETRY to zero as by step ST13, and starts the verify. Namely, the erase-verify controller 15c sequentially changes the internal address signals ADI so as to specify the memory cells M11 to Mmn. The erase-verify controller 15c supplies current to the selected digit line to see whether or not the selected memory cell is changed to the erased state. The reference level Vref is lower than a certain level at which all of the memory cells M11 to Mmn enter into the erased state. For this reason, the erase-verify controller 15c proceeds to step ST14 upon completion of the first verify, and increments the internal counter RETRY. The first verify is completed at time t4.

The erase and verify controller 15c changes the erase initiation signal ERASE to the positive power voltage level Vcc at time t4, and, accordingly, the complementary erase initiation signal CERASE is changed to the ground voltage level. The erase pulse generator 15f changes the internal control signal CTL4 in response to the erase initiation signal ERASE, and the level-shift circuit 15g boosts the internal control signal CTL4 to the erasing voltage level Vpp. The internal control signal CTL4 is maintained at the positive power voltage level Vcc for 10 milli-second as by step ST15.

The p-channel enhancement type switching transistor Qp4 turns on, and the n-channel enhancement type switching transistor Qn5 turns off. The source line VS is charged over the reference level Vref, and the accumulated electrons are evacuated from the floating gates.

Although the erase initiation signal ERASE is supplied to the potential monitor circuit 15d, the potential monitor circuit 15d does not change the internal control signal CTL3 to the ground voltage level, because the source line VS exceeds the reference level Vref.

The internal clock signal CTL4 is recovered to the ground voltage level at time t5, and the p-channel enhancement type switching transistor Qp4 turns off. The erase-verify controller 15c changes the erase initiation signal ERASE to the ground voltage level at time t6, and the complementary erase initiation signal CERASE causes the n-channel enhancement type switching transistor Qn5 to turn on. The source line VS is charged to the ground voltage level.

The erase-verify controller 15c starts the verify at time t6, and sequentially checks the memory cells M11 to Mmn to see whether or not they enter into the erased state as by step ST16. If the answer at step ST16 is "Fail", there are memory cells still in the write-in state, and the erase-verify controller 15c proceeds to step ST17. The erase-verify controller 15c checks the internal counter RETRY to see whether or not the erasing operation in the second phase repeats predetermined times Rmax. If the answer at step ST17 is given affirmative, the erase-verify controller 15c raises the erase initiation signal ERASE at time t7 again, and carries out the erase operation and the verify operation again.

While the answers at steps ST16 and ST17 are given "Fail" and "Yes", the erase-verify controller 15c repeats the erase and the verify by changing the erase initiation signal ERASE between the positive power voltage level Vcc and the ground voltage level.

When the answer at step ST16 is given "Pass", all of the memory cells M11 to Mmn enter into the erased state, and the erase-verify controller 15c supplies a diagnosis signal indicative of the entry into the erased state to the data port DS as by step ST18. Thus, the erase-verify controller 15c finishes the erase/verify mode.

On the other hand, if the answer at step ST17 is given negative without the answer "Pass" at step ST16, the erase-verify controller 15c supplies the diagnosis signal indicative of incompletion to the data port DS as by step ST19, and finishes the erase/verify mode.

The erase-verify controller 15c behaves as similar to that of the prior art in the second phase.

Figure 8:
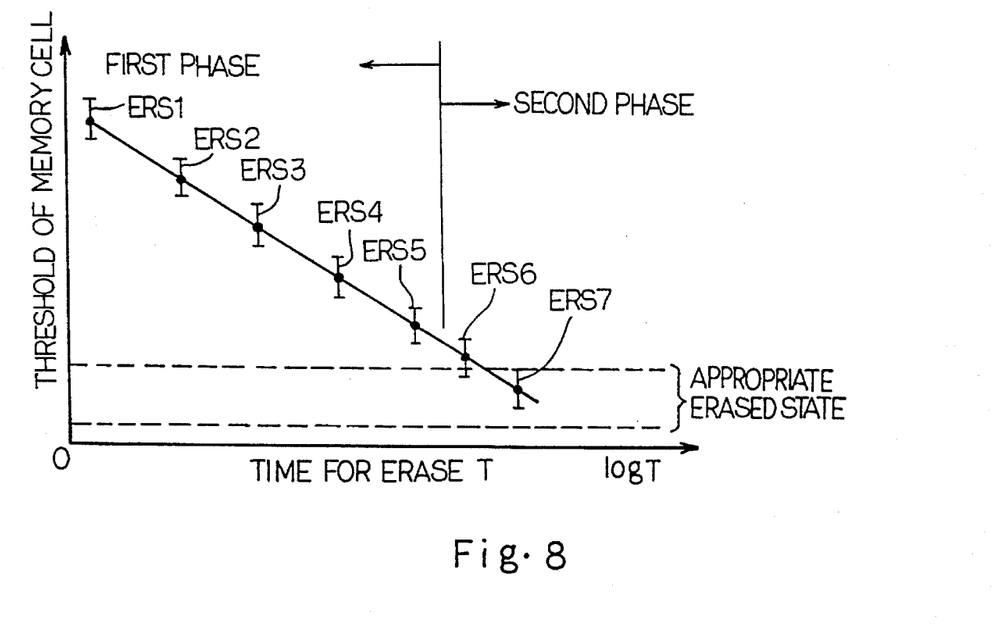
FIG. 8 is a graph showing the threshold in terms of the erasing time.

As will be appreciated from the foregoing description, the erase/verify system 15 decreases the threshold of the memory cells M11 to Mmn without the verify in the first phase, and the repetition of erase in the second phase is drastically decreased. As shown in FIG. 8, the prior art erase/verify system repeated the erase and the verify seven times ERS1 to ERS7. On the other hand, the erase/verify system 15 according to the present invention pulls down the threshold close to the appropriate erased state in the first phase, and repeats the erase and the verify only two times ERS6 and ERS7. Thus, the erase-verify controller 15c quickly changes the memory cells M11 to Mmn to the erased state.

Second Embodiment

Figure 9:
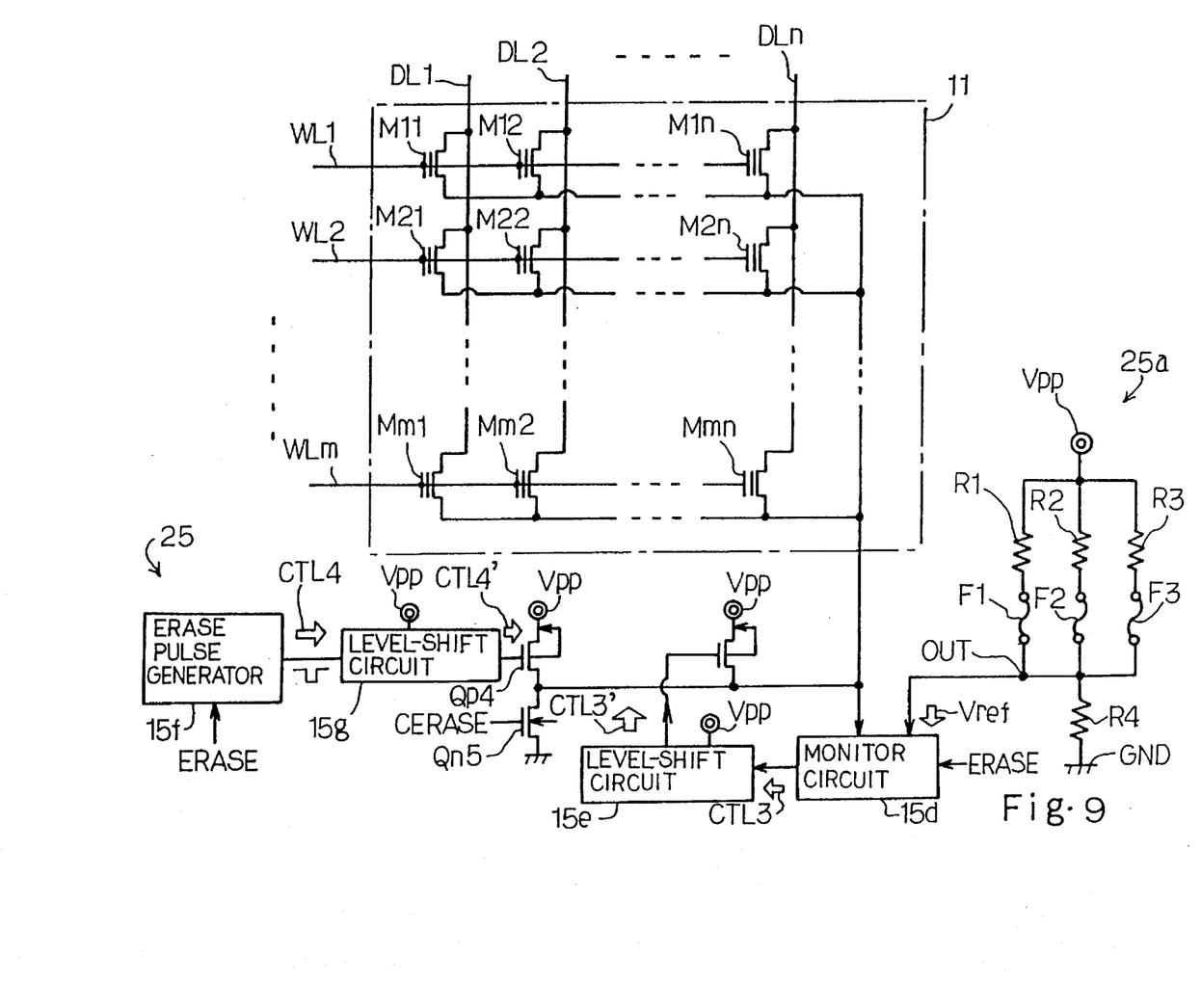
FIG. 9 is a block diagram showing the arrangement of another electrically erasable and programmable read only memory device according to the present invention.

Turning to FIG. 9 of the drawings, another electrically erasable and programmable read only memory device embodying the present invention is equipped with an erase/verify system 25. The memory cell array 11 and other systems are similar to those of the first embodiment, and are not described hereinbelow for avoiding repetition.

The erase/verify system 25 includes all of the circuits and units of the erase/verify system 15, and a variable reference voltage generator 25a is additionally provided for the erase/verify system 25. The variable reference voltage generator 25a is coupled between the source of erasing voltage Vpp and the ground voltage line GND, and three series combinations of resistor and fuse element R1/F1, R2/F2 and R3/F3 are coupled in parallel between the source of erasing voltage Vpp and an output node OUT. The output node OUT is coupled through a resistor R4 to the ground voltage line GND. The resistors R1, R2 and R3 are different in resistance, and the manufacturer selects one of the series combinations in the test after the completion of the fabrication process. Namely, one of the three fuse elements F1, F2 and F3 is left in the variable reference voltage generator 25a, and the others are broken. As a result, the reference voltage Vref is optimized depending upon the characteristics of the memory cells M11 to Mmn.

The function of the erase/verify system 25 after the installation into an electronic system is similar to that of the first embodiment, and is omitted for the sake of simplicity.

Although particular embodiments of the present invention have been shown and described, it will be obvious to those skilled in the art that various changes and modifications may be made without departing from the spirit and scope of the present invention.

For example, the memory cell array and the peripheral circuits may be multiplied on a semiconductor substrate, and the electrically erasable and programmable read only memory device may form a part of an ultra large scale integration together with other function blocks.

Some components such as a charging transistor may be shared between the first erasing sub-system and the second erasing sub-system for decreasing the number of components of the erase and verify system.

Moreover, after the completion of the first phase, the verify may be deleted. On the contrary, the erase-verify controller may produce the diagnosis signal upon completion of the verify immediately after the erase in the first phase.

What is claimed is:

1. A semiconductor memory device comprising:

a memory cell array having a plurality of memory cells each implemented by a floating gate type field effect transistor changed between an erased state and a write-in state depending upon a data bit stored therein;

a write-in means for writing data bits into memory cells selected from said plurality of memory cells;

a read-out means for reading said data bits from memory cells selected from said plurality of memory cells;

an addressing system responsive to address signals so as to select a memory cell from said memory cell array;

a source line connected to source nodes of said plurality of memory cells; and an erase and verify system enabled in an erase and verify mode having a first phase and a second phase next to said first phase, and including a first erasing means supplying an erasing signal of an active level to said source line in said first phase and monitoring a potential level on said source line for maintaining said erasing signal in said active level until said source line reaches a reference level close to said active level, a second erasing means intermittently supplying an erasing pulse signal of said active level to said source line for changing said plurality of memory cells to said erased state, and a verify means checking said plurality of memory cells to determine whether or not said plurality of memory cells enter into said erased state while said erasing pulse signal is staying in an inactive level.

2. The semiconductor memory device as set forth in claim 1, in which said reference level is 80 percent to 90 percent of the active level of said erasing signal.

3. The semiconductor memory device as set forth in claim 1, in which said first erasing means has a potential monitoring circuit enabled in response to an erase initiation signal for changing an internal control signal to an active level and monitoring said potential level on said source line to see whether or not said potential level reaches said reference level, said potential monitoring circuit changing said first internal control signal to an inactive level when said potential level on said source line reaches said reference level, a level-shift circuit for boosting said internal control signal of said inactive level to an erasing level, and a charging transistor coupled between a source of said erasing signal and said source line and responsive to said internal control signal supplied from said level-shift circuit so as to be changed between an on-state and an off-state.

4. The semiconductor memory device as set forth in claim 1, in which said first erasing means has a potential monitoring circuit enabled in response to an erase initiation signal for changing a first internal control signal to an active level and monitoring said potential level on said source line to see whether or not said potential level reaches said reference level, said potential monitoring circuit changing said first internal control signal to an inactive level when said potential level on said source line reaches said reference level, a first level-shift circuit for boosting said first internal control signal of said inactive level to an erasing level, and a first charging transistor coupled between a source of said erasing signal and said source line and responsive to said first internal control signal supplied from said first level-shift circuit so as to be changed between an on-state and an off-state, said second erasing means having an erase pulse generator responsive to said erase initiation signal for changing a second internal control signal to said active level for a time period, a second level-shift circuit for boosting said second internal control signal of an inactive level to said erasing level, a second charging transistor coupled between said source of erasing signal and said source line and responsive to said second internal control signal so as to be changed between said on-state and said off-state, and a discharging transistor coupled between said source line and a discharging line and responsive to said erase initiation signal of an inactive level for discharging said source line.

5. The semiconductor memory device as set forth in claim 4, in which said verify means checks said plurality of memory cells while said erase initiation signal remains in said inactive level.

6. The semiconductor memory device as set forth in claim 1, further comprising a reference voltage generator regulating said reference level to one of a plurality of candidates.

7. The semiconductor memory device as set forth in claim 6, in which said reference voltage generator includes a plurality of resistors coupled to a source of high voltage in parallel, a plurality of breakable fuse elements respectively coupled between said plurality of resistors and an output node of said reference voltage generator, and a resistor coupled between said output node and a source of low voltage level.

8. A semiconductor memory device comprising:

a memory cell array having a plurality of memory cells each implemented by a floating gate type field effect transistor changed between an erased state and a write-in state depending upon a data bit stored therein;

a write-in means for writing data bits into memory cells selected from said plurality of memory cells;

a read-out means for reading said data bits from memory cells selected from said plurality of memory cells;

an addressing system responsive to address signals so as to select a memory cell from said memory cell array;

a source line connected to source nodes of said plurality of memory cells; and an erase and verify system enabled in an erase and verify mode having a first phase and a second phase next to said first phase, and including;

a first erasing means supplying an erasing signal of an active level to said source line in said first phase and monitoring a potential level on said source line for maintaining said erasing signal in said active level until said source line reaches a reference level close to said active level, and first erasing means having;

a potential monitoring circuit enabled in response to an erase initiation signal for changing an internal control signal to an active level and monitoring said potential level on said source line to see whether or not said potential level reaches said reference level, said potential monitoring circuit changing said internal control signal to an inactive level when said potential level on said source line reaches said reference level, a level-shift circuit for boosting said internal control signal of said inactive level to an erasing level, and a charging transistor coupled between a source of said erasing signal and said source line and responsive to said internal control signal supplied from level-shift circuit so as to be changed between an on-state and an off-state, a second erasing means intermittently supplying an erasing pulse signal of said active level to said source line for changing said plurality of memory cells to said erased state, and a verify means checking said plurality of memory cells to determine whether or not said plurality of memory cells enter into said erased state while said erasing pulse signal is staying in an inactive level.

9. A semiconductor memory device comprising:

a memory cell array having a plurality of memory cells each implemented by a floating gate type filed effect transistor changed between an erased state and a write-in state dependent upon a data bit stored therein;

a write-in means for writing date bits into memory cells selected from said plurality of memory cells;

a read-out means for reading said data bits from memory cells selected from said plurality of memory cells;

an addressing system responsive to address signals so as to select a memory cell from said memory cell array;

a source line connected to source nodes of said plurality of memory cells; and an erase and verify system enable in an erase and verify mode having a first phase and a second phase next to said first phase, and including;

a first erasing means supplying an erasing signal of an active level to said source line in said first phase and monitoring a potential level on said source line for maintaining said erasing signal in said active level until said source line reaches a reference level close to said active level, said first erasing means having;

a potential monitoring circuit enabled in response to an erase initiation signal for changing a first internal control signal to an active level and monitoring said potential level on said source line to see whether or not said potential level reaches said reference level, said potential monitoring circuit changing said first internal control signal to an inactive level when said potential level on said source line reaches said reference level, a first level-shift circuit for boosting said first internal control signal of said inactive level to an erasing level, and a first charging transistor coupled between a source of said erasing signal and said source line and responsive to said first internal control signal supplied from said first level-shift circuit so as to be changed between an on-state and an off-state, a second erasing means intermittently supplying an erasing pulse signal of said active level to said source line for changing said plurality of memory cells to said erased state, said second erasing means having;

an erase pulse generator responsive to said erase initiation signal for changing a second internal control signal to said active level for a time period, a second level-shift circuit for boosting said second internal control signal of an inactive level to said erasing level, a second charging transistor coupled between said source of erasing signal and said source line and responsive to said second internal control signal so as to be changed between said on-state and said off-state, and a discharging transistor coupled between said source line and a discharging line and responsive to said erase initiation signal of an inactive level for discharging said source line, and a verify means checking a plurality of memory cells to determine whether or not said plurality of memory cells enter into said erased state while said erasing pulse signal is staying in an inactive level.

10. The semiconductor memory device as set forth in claim 9 in which said verify means checks said plurality of memory cells while said erase initiation signal remains in said inactive level.

11. A semiconductor memory device comprising:

a memory cell array having a plurality of memory cells each implemented by a floating gate type field effect transistor changed between an erased state and a write-in state depending upon a data bit stored therein;

a write-in device to write data bits into memory cells selected from said plurality of memory cells;

a read-out device to read said data bits from memory cells selected from said plurality of memory cells;

an addressing system responsive to address signals so as to select a memory cell from said memory cell array;

a source line connected to source nodes of said plurality of memory cell; and an erase and verify system enabled in an erase and verify mode having a first phase and a second phase next to said first phase, and including;

a first erasing device supplying an erasing signal of an active level to said source line in said first phase and monitoring a potential level on said source line to maintain said erasing signal in said active level until said source line reaches a reference level close to said active level, a second erasing device intermittently supplying an erasing pulse signal of said active level to said source line to change said plurality of memory cells to said erased state, and a verify device checking said plurality of memory cells to determine whether or not said plurality of memory cells enter into said erased state while said erasing pulse signal is staying in an inactive level.

* * * * *